(12) United States Patent
Cui et al.

(10) Patent No.: US 8,803,225 B2
(45) Date of Patent: Aug. 12, 2014

(54) TUNNELING FIELD EFFECT TRANSISTOR HAVING A LIGHTLY DOPED BURIED LAYER

(75) Inventors: Ning Cui, Beijing (CN); Renrong Liang, Beijing (CN); Jing Wang, Beijing (CN); Jun Xu, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 13/695,341

(22) PCT Filed: Sep. 6, 2012

(86) PCT No.: PCT/CN2012/081083
§ 371 (c)(1),
(2), (4) Date: Oct. 30, 2012

(87) PCT Pub. No.: WO2013/104193
PCT Pub. Date: Jul. 18, 2013

(65) Prior Publication Data
US 2013/0181185 A1    Jul. 18, 2013

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl.
USPC ........... 257/328; 257/339; 257/340; 257/341; 257/367; 257/401; 257/409; 257/E27.096; 257/E29.262

(58) Field of Classification Search
USPC ......... 257/328, 339, 340, 341, 367, 401, 409, 257/E27.096, E29.262
See application file for complete search history.

(56) References Cited

U.S. PATENT DOCUMENTS

| | | | | |
|---|---|---|---|---|
| 4,521,795 A * | 6/1985 | Coe et al. | | 257/341 |
| 5,057,884 A * | 10/1991 | Suzuki et al. | | 257/144 |
| 5,444,271 A * | 8/1995 | Kuwahara | | 257/136 |
| 5,485,022 A * | 1/1996 | Matsuda | | 257/133 |
| 5,894,150 A * | 4/1999 | Hshieh | | 257/335 |
| 6,114,207 A * | 9/2000 | Okabe et al. | | 438/270 |
| 6,184,555 B1 * | 2/2001 | Tihanyi et al. | | 257/342 |
| 6,664,590 B2 * | 12/2003 | Deboy | | 257/328 |
| 6,724,039 B1 * | 4/2004 | Blanchard | | 257/328 |
| 6,972,460 B2 * | 12/2005 | Aida et al. | | 257/341 |
| 7,176,520 B2 * | 2/2007 | Miyake et al. | | 257/327 |
| 7,217,954 B2 * | 5/2007 | Kusumoto et al. | | 257/77 |
| 8,202,775 B2 * | 6/2012 | Loechelt | | 438/212 |
| 8,482,058 B2 * | 7/2013 | Hoshino et al. | | 257/327 |
| 8,492,836 B2 * | 7/2013 | Miura et al. | | 257/339 |
| 8,658,483 B2 * | 2/2014 | Hsu et al. | | 438/183 |
| 2005/0104121 A1 * | 5/2005 | Disney | | 257/328 |
| 2010/0090271 A1 * | 4/2010 | Hefner et al. | | 257/328 |
| 2010/0258854 A1 * | 10/2010 | Tokano et al. | | 257/328 |

* cited by examiner

*Primary Examiner* — Ida M Soward
(74) *Attorney, Agent, or Firm* — Houtteman Law LLC

(57) ABSTRACT

A tunneling field effect transistor and a method for fabricating the same are provided. The tunneling field effect transistor includes: a semiconductor substrate and a drain layer formed in the semiconductor substrate, in which the drain layer is first type heavily doped; an epitaxial layer formed on the drain layer, with an isolation region formed in the epitaxial layer; a buried layer formed in the epitaxial layer, in which the buried layer is second type lightly doped; a source formed in the buried layer, in which the source is second type heavily doped; a gate dielectric layer formed on the epitaxial layer, and a gate formed on the gate dielectric layer; and a source metal contact layer formed on the source, and a drain metal contact layer formed under the drain layer.

10 Claims, 5 Drawing Sheets

TUNNELING FIELD EFFECT TRANSISTOR HAVING A LIGHTLY DOPED BURIED LAYER

CROSS-REFERENCE TO RELATED APPLICATION

This application claims priority to and benefits of Chinese Patent Application Serial No. 201210009396.7, filed with the State Intellectual Property Office of P. R. China on Jan. 12, 2012, the entire contents of which are incorporated herein by reference.

FIELD

The present disclosure relates to semiconductor design and fabrication field, and more particularly to a tunneling field effect transistor and a method for fabricating the same.

BACKGROUND

For a MOSFET (metal-oxide-semiconductor field-effect transistor) integrated circuit, an off-state leakage current may be quickly increased with a scaling down of a feature size of the integrated circuit. In order to decrease the leakage current so as to further reduce a power consumption of a device and improve a voltage-withstanding capability, a tunneling field effect transistor having a work principle different from that of MOSFET is widely used. Currently, a drain and a source of a conventional tunneling field effect transistor are located in a same plane of a semiconductor substrate. The tunneling field effect transistor with such a structure has a poor high-voltage-withstanding capability, a large on-state resistance and a high power consumption. Moreover, since a shape of the device is a regular quadrangle which has a smaller heat dissipation area, it is unfavorable for a heat dissipation. Therefore, how to improve the voltage-withstanding capability of the tunneling field effect transistor, to enhance the heat dissipation performance and to reduce the power consumption is one of technical problems that urgently need to be solved during a process of researching and developing the tunneling field effect transistor.

SUMMARY

The present disclosure is aimed to solve at least one of the defects, particularly defects of poor high-voltage-withstanding capability, large on-state resistance and high power consumption of a conventional tunneling field effect transistor. Accordingly, a tunneling field effect transistor with high-voltage-withstanding capability and a method for fabricating the same are provided.

According to an aspect of the present disclosure, a tunneling field effect transistor is provided. The tunneling field effect transistor comprises: a semiconductor substrate and a drain layer formed in the semiconductor substrate, in which the drain layer is first type heavily doped; an epitaxial layer formed on the drain layer, with an isolation region formed in the epitaxial layer; a buried layer formed in the epitaxial layer, in which the buried layer is second type lightly doped; a source formed in the buried layer, in which the source is second type heavily doped; a gate dielectric layer formed on the epitaxial layer, and a gate formed on the gate dielectric layer; and a source metal contact layer formed on the source, and a drain metal contact layer formed under the drain layer.

In one embodiment, a material of the epitaxial layer comprises: Si (silicon), SiGe (silicon germanium), SiC (silicon carbide) and a group III-V semiconductor material.

In one embodiment, the epitaxial layer is a Si/SiGe multi-layer structure.

In one embodiment, the epitaxial layer is intrinsic or lightly doped, which may enhance the high-voltage-withstanding capability of a device and adjust an on-state resistance to constrain a power consumption under a large current.

In one embodiment, a shape of the tunneling field effect transistor comprises: a polygonal shape, a circular shape, a shape made up of a line and an arc, and a shape made up of an irregular arc.

In one embodiment, the shape of the tunneling field effect transistor is a rhombus shape, which may increase a heat dissipating surface of the device so as to improve a heat dissipating capability of the device and optimize a characteristic of the device under a large current.

In one embodiment, the gate dielectric layer is a work function tuning layer.

In one embodiment, an isolation sidewall is formed at both sides of each of the gate dielectric layer and the gate.

In one embodiment, a material of each of an interface between the source metal contact layer and the source and an interface between the drain metal contact layer and the drain layer is a metal-semiconductor alloy.

In one embodiment, a passivation layer is formed on the source metal contact layer and the gate, and a plurality of contact holes are formed in the passivation layer and penetrate through the passivation layer to the source metal contact layer and the gate respectively.

In one embodiment, a plurality of metallic interconnections are formed on the passivation layer and connected with the source metal contact layer and the gate via the plurality of contact holes respectively.

With the tunneling field effect transistor according to embodiments of the present disclosure, by disposing a second type non-heavy doping region (i.e., the buried layer) near to the source and a first type non-heavy doping region (i.e., the epitaxial layer) near to the drain layer, the voltage-withstanding capability of the device in an off state may be improved. However, because of a field effect of a gate voltage in an on-state, an electron accumulation or an electron inversion may be formed on a surface of the device, so that the two regions (i.e., the buried layer and the epitaxial layer) may not influence on-state characteristics of the device. In addition, the tunneling field effect transistor according to embodiments of the present disclosure has a vertical structure. A length of a channel region of the tunneling field effect transistor is longer than that of a channel region of a conventional planar tunneling field effect transistor, and a cross-sectional area of the tunneling field effect transistor is larger than that of the conventional planar tunneling field effect transistor, which may improve a high-voltage-withstanding capability of a source and a drain of a device and optimize a characteristic of the device under a large current.

According to another aspect of the present disclosure, a method for fabricating a tunneling field effect transistor is provided. The method comprises steps of: S1: providing a semiconductor substrate and forming a drain layer which is first type heavily doped; S2: forming an epitaxial layer on the drain layer; S3: forming an isolation region in the epitaxial layer; S4: forming a gate dielectric layer on the epitaxial layer, and forming a gate on the gate dielectric layer; S5: performing a photolithography, an ion-implanting, a diffusion and an annealing to form a buried layer which is second type lightly doped; S6: performing a photolithography, an ion-implanting, a diffusion and an annealing to form a source which is second type heavily doped; and S7: forming a source metal contact layer on the source, and forming a drain metal contact layer under the drain layer.

In one embodiment, after the step S6, the method further comprises: forming an isolation sidewall at both sides of each of the gate dielectric layer and the gate.

In one embodiment, after the step S7, the method further comprises steps of: S8: forming a passivation layer on the source metal contact layer and the gate, and forming a plurality of contact holes in the passivation layer, in which the plurality of contact holes penetrate through the passivation layer to the source metal contact layer and the gate respectively; and S9: forming a plurality of metallic interconnections on the passivation layer, in which the plurality of metallic interconnections are connected with the source metal contact layer and the gate via the plurality of contact holes respectively.

In one embodiment, a material of the epitaxial layer comprises: Si, SiGe, SiC and a group III-V semiconductor material.

In one embodiment, the epitaxial layer is intrinsic or lightly doped.

In one embodiment, a shape of the tunneling field effect transistor comprises: a polygonal shape, a circular shape, a shape made up of a line and an arc, and a shape made up of an irregular arc.

In one embodiment, the shape of the tunneling field effect transistor is a rhombus shape.

In one embodiment, the gate dielectric layer is a work function tuning layer.

In one embodiment, a material of each of an interface between the source metal contact layer and the source and an interface between the drain metal contact layer and the drain layer is a metal-semiconductor alloy.

With the method for fabricating the tunneling field effect transistor according to embodiments of the present disclosure, by forming the lightly doped or intrinsic epitaxial layer, a high-voltage-withstanding capability of the device may be enhanced, an on-state resistance may be adjusted and a power consumption under a large current may be constrained; and by forming a second type non-heavily-doped region (i.e., the buried layer) near the source and forming a first type non-heavily-doped region (i.e., the epitaxial layer) near the drain layer, the voltage-withstanding capability of the device in an off state may be improved.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

Figure 1:
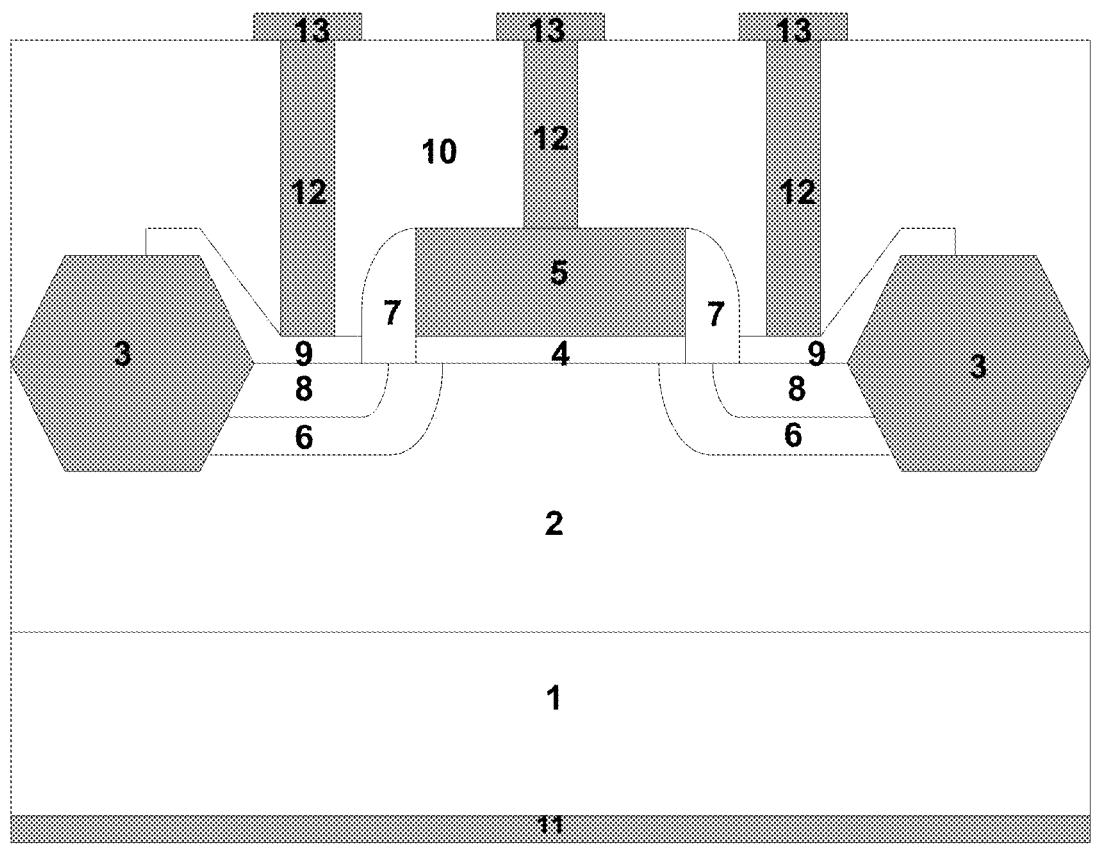
FIG. 1 is a schematic cross-sectional view of a tunneling field effect transistor according to an embodiment of the present disclosure.

REFERENCE NUMERALS 1 drain layer; 2 epitaxial layer; 3 isolation region; 4 gate dielectric layer; 5 gate; 6 buried layer; 7 isolation sidewall; 8 source; 9 source metal contact layer; 10 passivation layer; 11 drain metal contact layer; 12 contact hole; 13 metallic interconnection.

DETAILED DESCRIPTION

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature, and may also include an embodiment in which an additional feature is formed between the first feature and the second feature so that the first feature does not directly contact the second feature.

In addition, terms such as "first" and "second" are used herein for purposes of description and are not intended to indicate or imply relative importance or significance or imply a number of technical features indicated. Therefore, a "first" or "second" feature may explicitly or implicitly comprise one or more features. Further, in the description, unless indicated otherwise, "a plurality of" refers to two or more.

FIG. 1 is a schematic cross-sectional view of a tunneling field effect transistor according to an embodiment of the present disclosure. It should be noted that a size of each region shown in the drawings is exemplary, and the particular size of each region may be designed according to requirements for device parameters.

As shown in FIG. 1, the tunneling field effect transistor comprises: a semiconductor substrate and a drain layer 1 formed in the semiconductor substrate, in which the drain layer 1 is first type heavily doped; an epitaxial layer 2 formed on the drain layer 1, with an isolation region 3 formed in the epitaxial layer 2; a buried layer 6 formed in the epitaxial layer 2, in which the buried layer 6 is second type lightly doped; a source 8 formed in the buried layer 6, in which the source 8 is second type heavily doped; a gate dielectric layer 4 formed on the epitaxial layer 2, and a gate 5 formed on the gate dielectric layer 4; and a source metal contact layer 9 formed on the source 8, and a drain metal contact layer 11 formed under the drain layer 1.

A material of the semiconductor substrate may be any semiconductor substrate material used for fabricating a tunneling field effect transistor, and specifically may be, but is not limited to, semiconductor materials such as Si, SiGe, Ge (germanium) or GaAs (gallium arsenide). The drain layer 1 is formed in the semiconductor substrate, and the drain layer 1 is first type heavily doped.

The epitaxial layer 2 is formed on the drain layer 1. A lattice of a material of the epitaxial layer 2 is matched with that of the material of the semiconductor substrate. In this embodiment, the material of the epitaxial layer 2 may be, but is not limited to, Si, SiGe, SiC or a group III-V semiconductor material. In one embodiment, the epitaxial layer 2 may be a Si/SiGe multilayer structure. Preferably, the epitaxial layer 2 may be intrinsic or lightly doped, which may enhance the high-voltage-withstanding capability of a device and adjust an on-state resistance to constrain a power consumption under a large current.

The isolation region 3 is formed in the epitaxial layer 2, and the isolation region 3 may be a field oxide region or a shallow trench isolation (STI). In this embodiment, the field oxide region is used to isolate different active regions.

The buried layer 6 is formed in the epitaxial layer 2, and the buried layer 6 is second type lightly doped. By forming the buried layer, the voltage-withstanding capability of the device in an off-state may be improved. However, because of an effect of a gate voltage in an on-state, an electron accumulation or an electron inversion may be formed on the surface of the device, so that this region may not influence on-state characteristics of the device.

The source 8 is formed in the buried layer 6, and the source 8 is second type heavily doped.

The gate dielectric layer 4 is formed on the epitaxial layer 2. A material of the gate dielectric layer 4 may be any gate dielectric material used for fabricating a tunneling field effect transistor, and specifically may be, but is not limited to, a high k dielectric, $SiO_2$ (silicon dioxide), or a material with a work function adjusting function. In this embodiment, the gate dielectric layer 4 may be a work function tuning layer which can adjust the work function of the epitaxial layer 2. For an n-type epitaxial layer, a material of the work function tuning layer may be, but is not limited to, $HfO_2$ (hafnium oxide). For a p-type epitaxial layer, the material of the work function tuning layer may be, but is not limited to, a compound of Al. The gate 5 is formed on the gate dielectric layer 4. In this embodiment, the gate 5 may be, but is not limited to, a poly-silicon gate or a metal gate.

The source metal contact layer 9 is formed on the source 8, and the drain metal contact layer 11 is formed on a back surface of the semiconductor substrate (that is, under the drain layer 1). A material of each of an interface between the source metal contact layer 9 and the source 8 and an interface between the drain metal contact layer 11 and the drain layer 1 may be a metal-semiconductor alloy, for example, a metal silicide.

The tunneling field effect transistor according to embodiments of the present disclosure has a vertical structure. A length of a channel region of the tunneling field effect transistor is longer than that of a channel region of a conventional planar tunneling field effect transistor, and a cross-sectional area of the tunneling field effect transistor is larger than that of the conventional planar tunneling field effect transistor, which may improve a high-voltage-withstanding capability of a source and a drain of a device and optimize a characteristic of the device under a large current.

In this embodiment, a shape of the tunneling field effect transistor may be a polygonal shape, a circular shape, a shape made up of a line and an arc, or a shape made up of an irregular arc. Preferably, the shape of the tunneling field effect transistor may be a rhombus shape, which may increase a heat dissipating surface of the device so as to improve a heat dissipating capability of the device and optimize a characteristic of the device under a large current.

An isolation sidewall 7 is formed at both sides of each of the gate dielectric layer 4 and the gate 5. A passivation layer 10 is formed on the source metal contact layer 9 and the gate 5, and a plurality of contact holes 12 are formed in the passivation layer 10 and penetrate through the passivation layer 10 to the source metal contact layer 9 and the gate 5 respectively. A plurality of metallic interconnections 13 are formed on the passivation layer 10 and connected with the source metal contact layer 9 and the gate 5 via the plurality of contact holes 12 respectively.

A method for fabricating the tunneling field effect transistor according to an embodiment of the present disclosure will be described below in detail with reference to FIGS. 2-10. The tunneling field effect transistor shown in FIG. 1 may be fabricated according to steps illustrated in FIGS. 2-10. Only the n-type tunneling field effect transistor formed on an n-type semiconductor substrate is described herein. For the p-type tunneling field effect transistor, a doping type may be correspondingly changed with reference to the n-type tunneling field effect transistor according to an embodiment of the present disclosure. The method comprises following steps.

Figure 2:
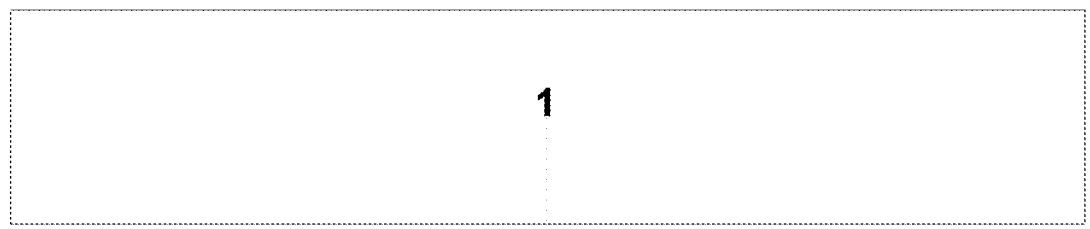
FIGS. 2-10 are schematic cross-sectional views of intermediate statuses of a tunneling field effect transistor formed in steps of a method for fabricating a tunneling field effect transistor according to an embodiment of the present disclosure.

In step S1, a semiconductor substrate is provided and a drain layer 1 which is first type heavily doped is formed in the semiconductor substrate, as shown in FIG. 2. In this embodiment, the semiconductor substrate may be an n-type lightly doped semiconductor substrate. Then, the n-type heavily doped drain layer 1 is formed by performing an ion implanting and a diffusing in the semiconductor substrate.

Figure 3:
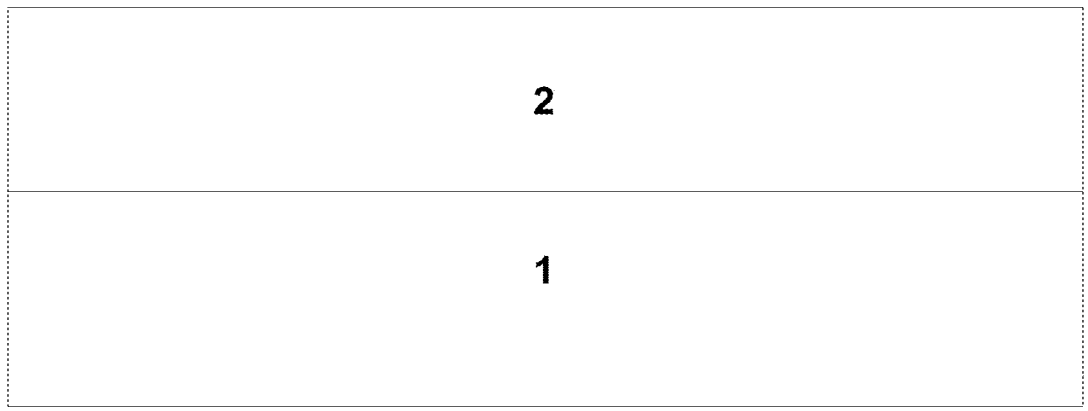

In step S2, an epitaxial layer 2 is formed on the drain layer 1, as shown in FIG. 3. In this embodiment, a material of the epitaxial layer 2 may be, but is not limited to, Si, SiGe, SiC or a group III-V semiconductor material. In one embodiment, the epitaxial layer 2 may be a Si/SiGe multilayer structure. Preferably, the epitaxial layer 2 may be intrinsic or lightly doped, which may enhance the high-voltage-withstanding capability of a device and adjust an on-state resistance to constrain a power consumption under a large current.

Figure 4:
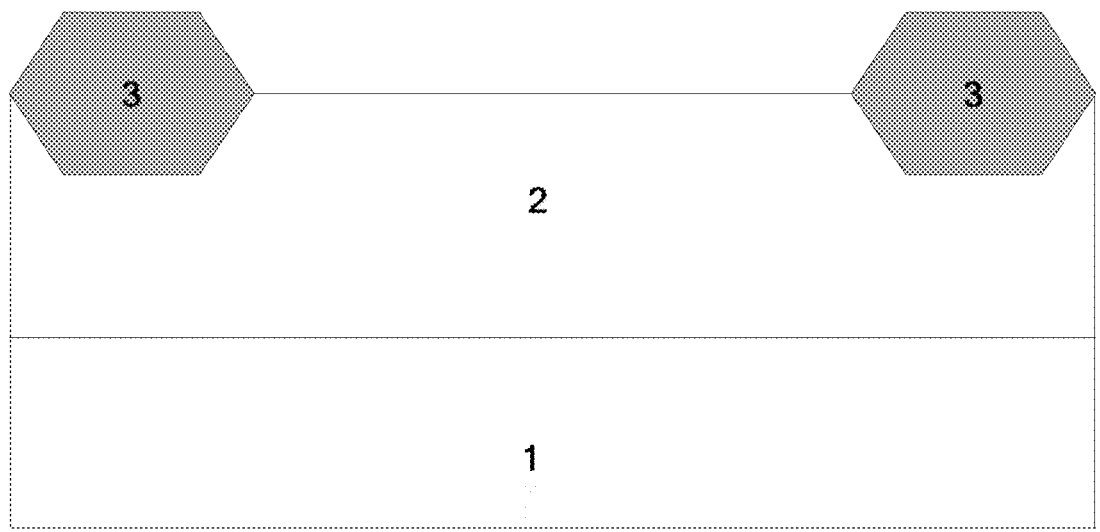

In step S3, an isolation region 3 is formed in the epitaxial layer 2. The isolation region 3 may be a field oxide region or a shallow trench isolation (STI). In this embodiment, the field oxide region is used to isolate different active regions. Specifically, a protective dielectric layer is deposited on the epitaxial layer 2, a photoresist pattern is formed by performing a photolithography, etching with a patterned mask, and removing a photoresist, and then the field oxide region 3 is formed by oxidizing and etching to remove a part of the protective dielectric layer under a protection of the photoresist pattern, as shown in FIG. 4. In this embodiment, a material of the protective dielectric layer may be silicon nitride, and a material of the field oxide region 3 may be silicon dioxide.

Figure 5:
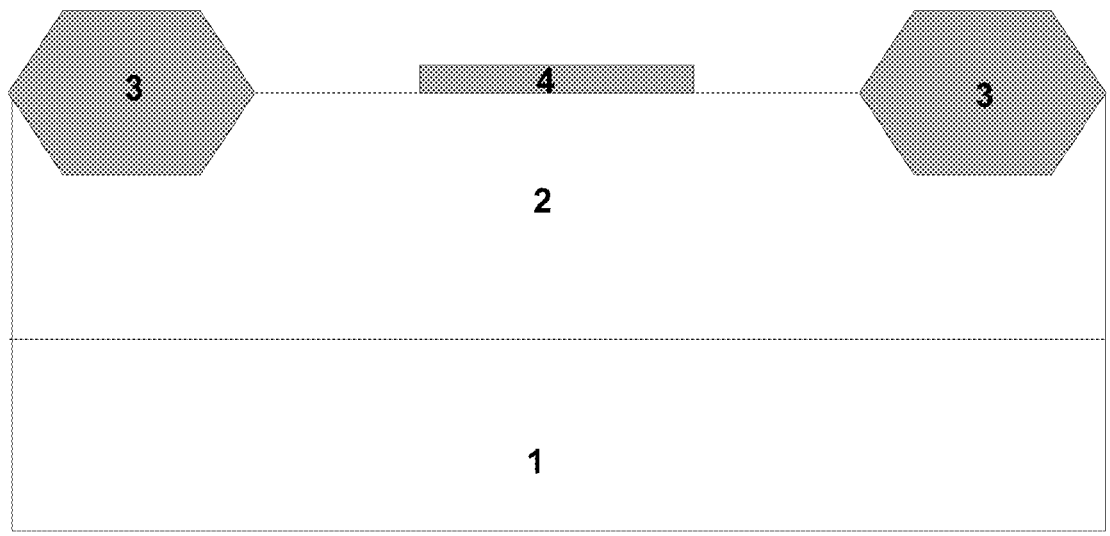
Figure 6:
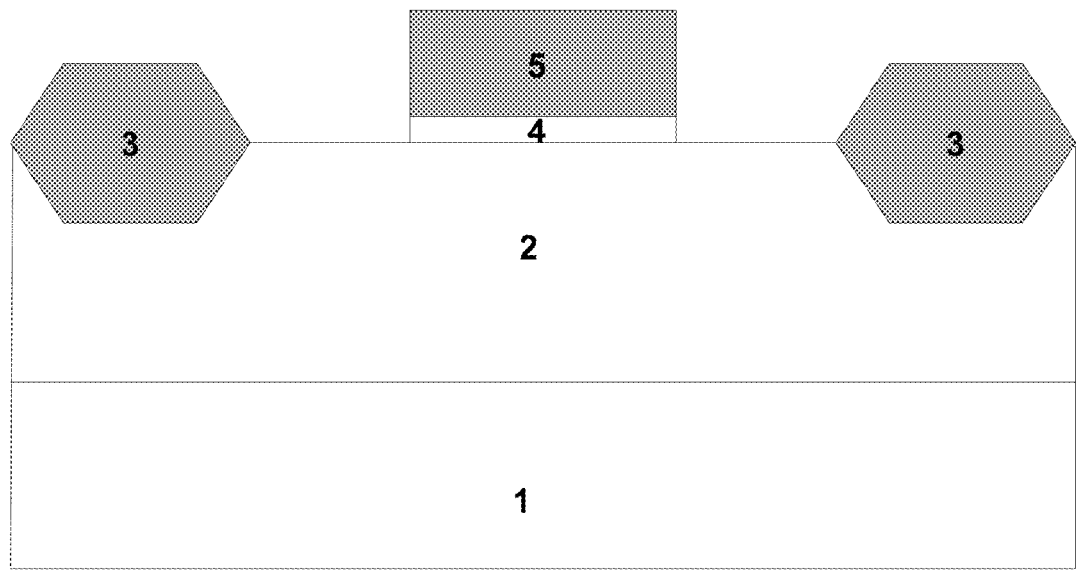

In step S4, a gate dielectric layer 4 is formed on the epitaxial layer 2, and a gate 5 is formed on the gate dielectric layer 4. Specifically, the gate dielectric layer 4 may be formed by first depositing a gate dielectric material and then coating a photoresist, performing a photolithography, etching and removing the photoresist, as shown in FIG. 5. A material of the gate dielectric layer 4 may be, but is not limited to, $SiO_2$, $HfO_2$ or a material with a work function adjusting function. In this embodiment, the gate dielectric layer 4 may be a work function tuning layer which can adjust the work function of the epitaxial layer 2. For an n-type epitaxial layer, a material of the work function tuning layer may be, but is not limited to, $HfO_2$. For a p-type epitaxial layer, a material of the work function tuning layer may be, but is not limited to, a compound of Al. The gate 5 may be formed by depositing a gate material, including, but not limited to, poly-silicon or a metal, on the gate dielectric layer 4; and then coating a photoresist, performing a photolithography, etching and removing the photoresist, as shown in FIG. 6.

Figure 7:
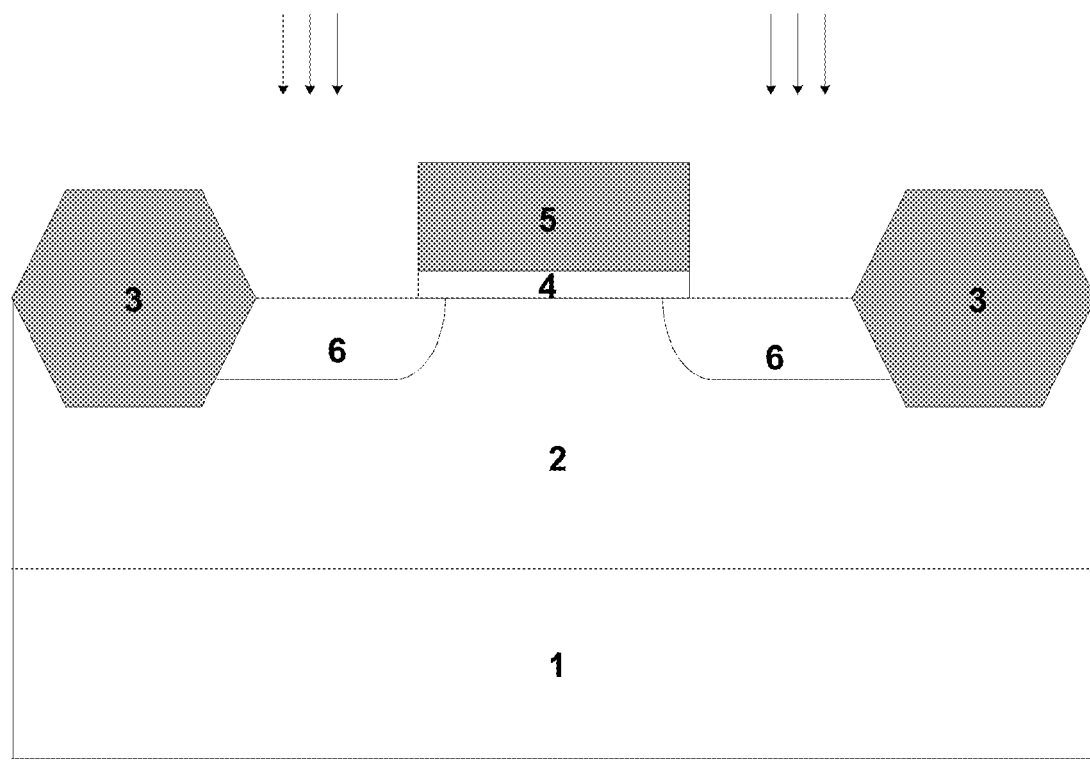

In step S5, a buried layer 6 which is second type lightly doped is formed by performing a photolithography, ion implanting with a patterned mask, diffusing and annealing. In this embodiment, an n-type lightly doped buried layer 6 is formed in the epitaxial layer 2, as shown in FIG. 7.

Figure 8:
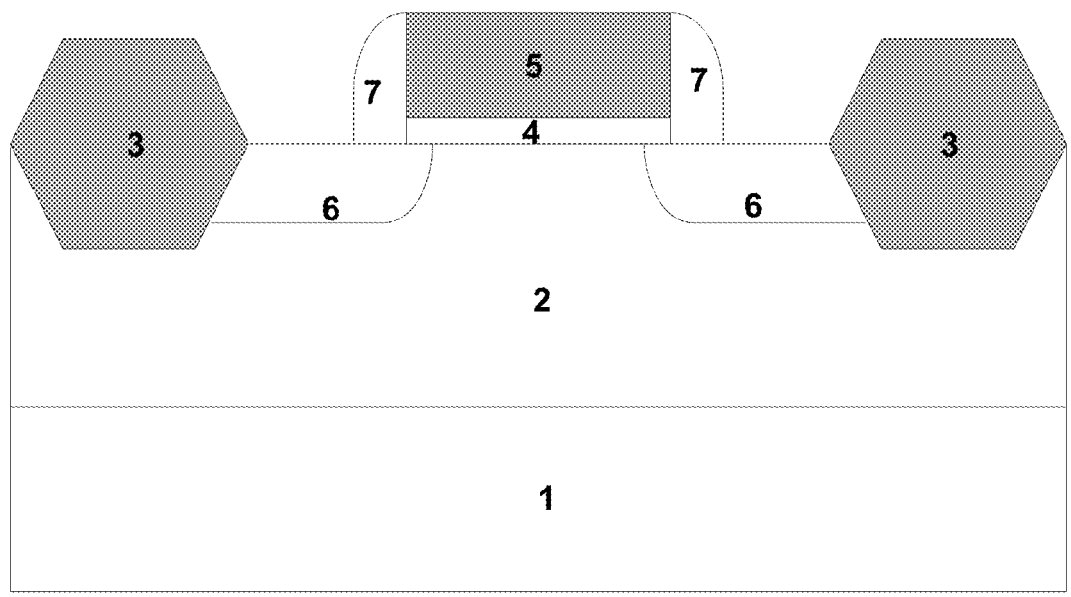

In this embodiment, after the step S5, the method further comprises: forming an isolation sidewall 7 at both sides of the gate dielectric layer 4 and the gate 5 (i.e., a gate stack). Specifically, the isolation sidewall 7 may be formed at both sides of the gate stack by depositing a protective dielectric such as silicon dioxide or silicon oxynitride and then dry etching, as shown in FIG. 8.

Figure 9:
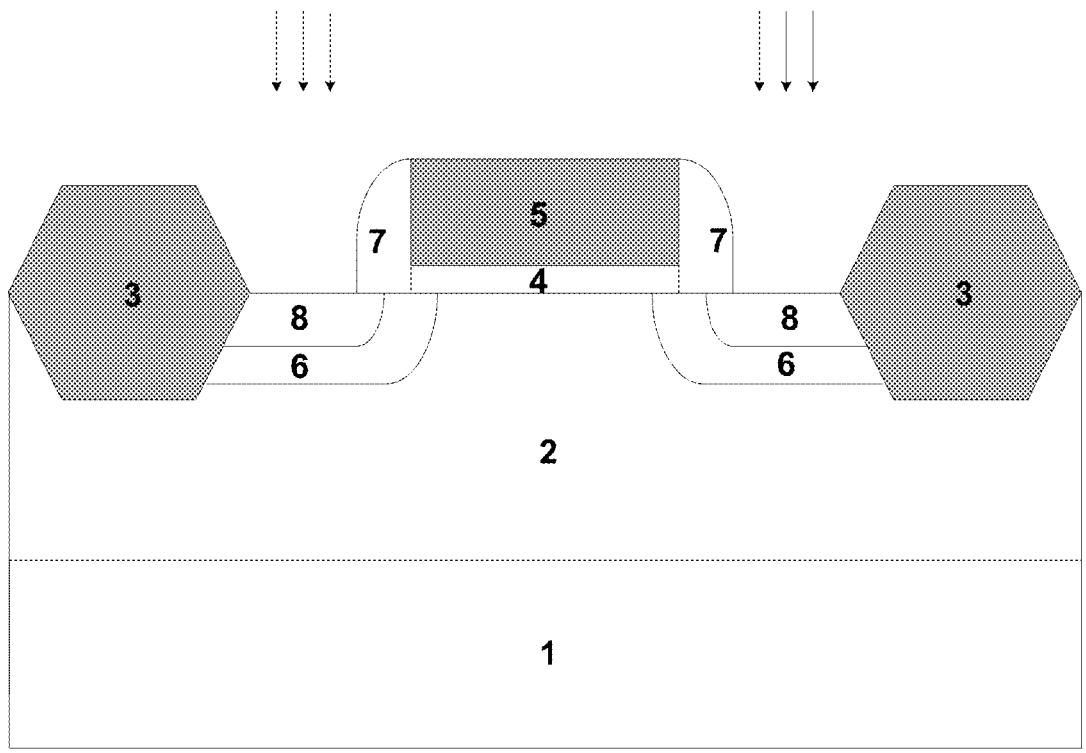

In step S6, a source 8 which is second type heavily doped is formed by performing a photolithography, ion implanting with a patterned mask, diffusing and annealing. In this embodiment, the source 8 is located in the buried layer 6 and exposed on an upper surface of the epitaxial layer 2, as shown in FIG. 9.

Figure 10:
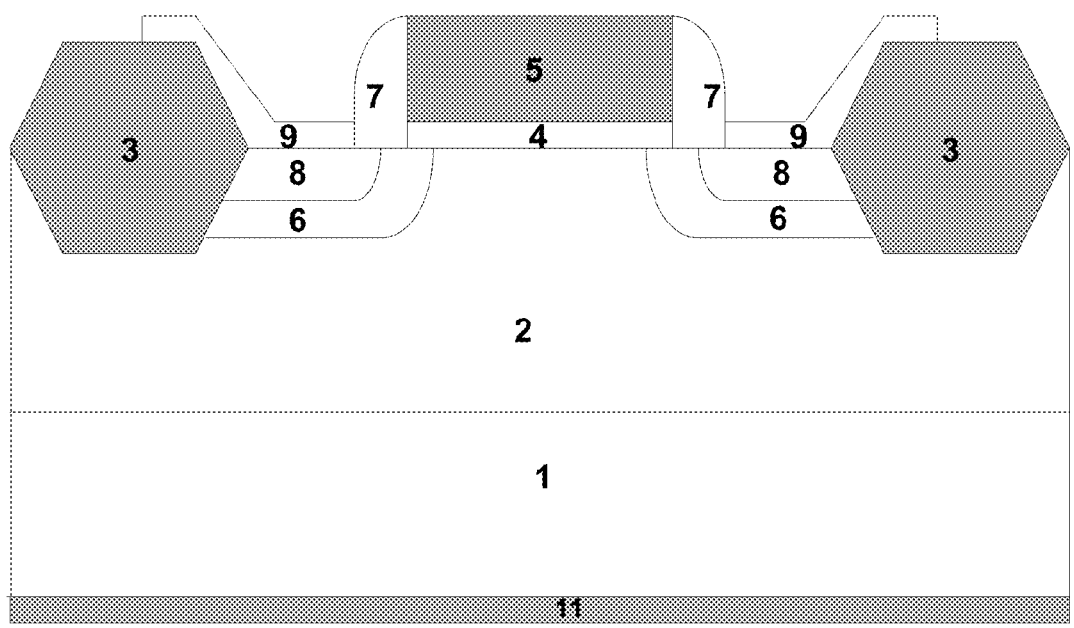

In step S7, a source metal contact layer 9 is formed on the source 8, and a drain metal contact layer 11 is formed under the drain layer 1, as shown in FIG. 10. In this embodiment, an ohmic contact is formed between the source metal contact layer 9 and the source 8, and an ohmic contact is formed between the drain metal contact layer 11 and the drain layer 1. A material of each of an interface between the source metal contact layer 9 and the source 8 and an interface between the drain metal contact layer 11 and the drain layer 1 may be, but is not limited to, a metal-semiconductor alloy, such as a metal silicide.

In this embodiment, after the step S7, the method may further comprise following steps.

In step S8, a passivation layer 10 is formed on the source metal contact layer 9 and the gate 5, and then a plurality of contact holes 12 are formed in the passivation layer 10 by performing a photolithography and etching. The plurality of contact holes 12 penetrate through the passivation layer 10 to the source metal contact layer 9 and the gate 5 respectively.

In step S9, a plurality of metallic interconnections 13 are formed on the passivation layer 10. The plurality of metallic interconnections 13 are connected with the source metal contact layer 9 and the gate 5 via the plurality of contact holes 12 respectively, as shown in FIG. 1.

In this embodiment, a shape of the tunneling field effect transistor may be a polygonal shape, a circular shape, a shape made up of a line and an arc, or a shape made up of an irregular arc. Preferably, the shape of the tunneling field effect transistor may be a rhombus shape, which may increase a heat dissipating surface of the device so as to improve a heat dissipating capability of the device and optimize a characteristic of the device under a large current.

With the method for fabricating the tunneling field effect transistor according to embodiments of the present disclosure, by forming the lightly doped or intrinsic epitaxial layer, a high-voltage-withstanding capability of the device may be enhanced, an on-state resistance may be adjusted and a power consumption under a large current may be constrained; and by forming a second type non-heavily-doped region (i.e., the buried layer) near the source and forming a first type non-heavily-doped region (i.e., the epitaxial layer) near the drain layer, the voltage-withstanding capability of the device in an off state may be improved.

Reference throughout this specification to "an embodiment", "some embodiments", "one embodiment", "an example", "a specific examples", or "some examples" means that a particular feature, structure, material, or characteristic described in connection with the embodiment or example is included in at least one embodiment or example of the disclosure. Thus, the appearances of the phrases such as "in some embodiments", "in one embodiment", "in an embodiment", "an example", "a specific examples", or "some examples" in various places throughout this specification are not necessarily referring to the same embodiment or example of the disclosure. Furthermore, the particular features, structures, materials, or characteristics may be combined in any suitable manner in one or more embodiments or examples.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A tunneling field effect transistor, comprising:
a semiconductor substrate and a drain layer formed in the semiconductor substrate, wherein the drain layer is first type heavily doped;
an epitaxial layer formed on the drain layer, with an isolation region formed in the epitaxial layer, and the epitaxial layer is first type lightly doped or intrinsic;
a buried layer formed in the epitaxial layer, wherein the buried layer is second type lightly doped;
a source formed in the buried layer, wherein the source is second type heavily doped;
a gate dielectric layer formed on the epitaxial layer, and a gate formed on the gate dielectric layer; and
a source metal contact layer formed on the source, and a drain metal contact layer formed under the drain layer, wherein carriers in the buried layer are capable of accumulating by applying a suitable gate voltage during a working process of the tunneling field effect transistor.

2. The tunneling field effect transistor according to claim 1, wherein a material of the epitaxial layer comprises: Si, SiGe, SiC and a group III-V semiconductor material.

3. The tunneling field effect transistor according to claim 2, wherein the epitaxial layer is a Si/SiGe multilayer structure.

4. The tunneling field effect transistor according to claim 1, wherein a shape of the tunneling field effect transistor comprises: a polygonal shape, a circular shape, a shape made up of a line and an arc, and a shape made up of an irregular arc.

5. The tunneling field effect transistor according to claim 4, wherein the shape of the tunneling field effect transistor is a rhombus shape.

6. The tunneling field effect transistor according to claim 1, wherein the gate dielectric layer is a work function tuning layer.

7. The tunneling field effect transistor according to claim 1, wherein an isolation sidewall is formed at both sides of each of the gate dielectric layer and the gate.

8. The tunneling field effect transistor according to claim 1, wherein a material of each of an interface between the source metal contact layer and the source and an interface between the drain metal contact layer and the drain layer is a metal-semiconductor alloy.

9. The tunneling field effect transistor according to claim 1, wherein a passivation layer is formed on the source metal contact layer and the gate, and a plurality of contact holes are formed in the passivation layer and penetrate through the passivation layer to the source metal contact layer and the gate respectively.

10. The tunneling field effect transistor according to claim 9, wherein a plurality of metallic interconnections are formed on the passivation layer and connected with the source metal contact layer and the gate via the plurality of contact holes respectively.

* * * * *